(12) United States Patent
Horn

(10) Patent No.: US 6,854,583 B1
(45) Date of Patent: Feb. 15, 2005

(54) CONVEYORIZED STORAGE AND TRANSPORTATION SYSTEM

(75) Inventor: George Horn, Woburn, MA (US)

(73) Assignee: Middlesex General Industries, Inc., Woburn, MA (US)

( * ) Notice: Subject to any disclaimer, the term of this patent is extended or adjusted under 35 U.S.C. 154(b) by 0 days.

(21) Appl. No.: 10/433,828

(22) PCT Filed: Feb. 6, 2002

(86) PCT No.: PCT/US02/03443

§ 371 (c)(1), (2), (4) Date: Jun. 5, 2003

(87) PCT Pub. No.: WO02/062680

PCT Pub. Date: Aug. 15, 2002

Related U.S. Application Data

(60) Provisional application No. 60/266,715, filed on Feb. 6, 2001.

(51) Int. Cl.$^7$ .............................................. B65G 59/00
(52) U.S. Cl. ................ 198/348; 198/346.2; 198/347.1; 198/358; 700/213
(58) Field of Search .............................. 198/348, 346.2, 198/346.3, 347.1, 347.4, 358; 700/213, 229, 230

(56) References Cited

U.S. PATENT DOCUMENTS

| | | | | |
|---|---|---|---|---|
| 5,078,257 A | * | 1/1992 | Carter, Jr. ................. | 198/369.5 |
| 5,086,910 A | | 2/1992 | Terpstra ...................... | 198/572 |
| 5,285,887 A | | 2/1994 | Hall ............................ | 198/460 |
| 5,358,097 A | | 10/1994 | Bakkila et al. ............. | 198/781 |
| 5,577,596 A | * | 11/1996 | Van Essen ................... | 198/349 |
| 5,636,966 A | * | 6/1997 | Lyon et al. ............... | 414/791.6 |
| 5,893,697 A | * | 4/1999 | Zini et al. .................... | 414/273 |
| 5,937,994 A | * | 8/1999 | de Barbuat ............... | 198/346.2 |
| 5,953,234 A | * | 9/1999 | Singer et al. ............... | 700/214 |
| 5,957,648 A | * | 9/1999 | Bachrach ..................... | 414/217 |
| 6,039,316 A | * | 3/2000 | Jackson et al. ............. | 271/194 |
| 6,240,335 B1 | * | 5/2001 | Wehrung et al. ............ | 700/230 |
| 6,321,138 B1 | * | 11/2001 | Livesay et al. ............. | 700/245 |
| 6,702,099 B2 | * | 3/2004 | Otaguro et al. .......... | 198/468.6 |

FOREIGN PATENT DOCUMENTS

EP                0738674 A2        10/1996

OTHER PUBLICATIONS

Cleanroom "Sea of Lots" Concept article; undated.
Dresdner Transfer Brief; Sea of Lots, Issue Feb. 2000.
Semiconductor International, New Twists on 300 mm Fab Design and Layout, Michael Weiss, PRI Automation Inc., Jul. 1, 1999.

* cited by examiner

*Primary Examiner*—Douglas Hess
(74) *Attorney, Agent, or Firm*—Weingarten, Schurgin, Gagnebin & Lebovici LLP

(57) ABSTRACT

A configurable storage system particularly suited for use with clean environment conveyors is disclosed. The storage system includes modular conveyor track elements which may be provided as one way paths which, when provided with plural transfer elements with respect to a conveyor highway, enable the rotation of a workpiece from a storage matrix to a transfer path and back to the storage matrix.

32 Claims, 5 Drawing Sheets

CONVEYORIZED STORAGE AND TRANSPORTATION SYSTEM

CROSS REFERENCE TO RELATED APPLICATIONS

This application claims priority under 35 U.S.C. §119(e) to U.S. Provisional Patent Application No. 60/266,715 filed Feb. 6, 2001, the disclosure of which is hereby incorporated by reference.

STATEMENT REGARDING FEDERALLY SPONSORED RESEARCH OR DEVELOPMENT

N/A

BACKGROUND OF THE INVENTION

In clean-environment manufacturing industries, such as the manufacturing of flat panel display devices and semiconductors, there is a need to handle large amounts of in-process inventories. In these industries, discrete vehicle-type transports, such as monorail vehicles or automated guided vehicles, have prevailed, especially in the front-end of clean manufacturing processes. Manually operated vehicle-type carts have served such industries as well.

Historically, a conveyor methodology of transport has not been accepted in these industries, where ultra-clean handling of material is required. Recent advances in conveyor technology have made conveyor systems more attractive for use in clean-environment manufacturing industries. Some of these advances include: improved cassettes for riding directly on the conveyor and limiting the bounce in wafers carried thereon; standardized runners for accepting different-sized carriers to reduce the need for customized conveyor belt sizes; providing distributed control to convey items substantially independently without collisions; selective control of carrier movement to reduce gaps between carriers or items being conveyed; and reducing particulate generation through the use of clutches in drive wheels.

Typically, multiple wafers or substrates, several times the amount in-process, are stored for access during the manufacturing process, regardless of the transport mechanism. Stockers have been employed with conventional discrete-vehicle transport systems. Such systems employ a central robot which has access to plural floor-mounted storage cabinets providing bins, shelves or other storage space. A work-piece to be stored is transported to a designated transfer position on the conveying system. It is then retrieved by the stocker robot, which is then manipulated to place the work-piece in the appropriate storage location. As is evident, no parallel work-piece manipulations can be executed by the stocker robot while this storing activity is underway. The same limitation to single work-piece manipulation exists when the stocker robot is in the process of retrieving a work-piece. The stocker becomes a bottle-neck for work-piece flow.

Another deficiency associated with stockers pertains to the amount of floor space which such systems typically occupy. Floor space adjacent a conveying system and in a manufacturing environment may be at a premium. If multiple stockers are provided as a means for lessening the bottleneck in work-piece flow as compared to the use of a single stocker, that much more floor space is consumed. The cost of the overall system is significantly raised as a consequence.

The introduction of the clean conveyor system and the vehicle transport method by the Applicants requires a storage and buffer solution for work-in-process material that is in harmony with the conveyor transport methodology, and is the equivalent of the above-mentioned stockers in terms of storage capacity and accessibility to the conveying system.

BRIEF SUMMARY OF THE INVENTION

The presently disclosed system includes an easily configurable storage system which is particularly well-suited for use with clean-environment conveyors, such as those described in U.S. Pat. No. 6,047,812 to Horn et al, incorporated herein by reference. The storage system includes modular conveyor elements which may be provided parallel to and adjacent a ceiling mounted conveyor network. The conveyor elements may be provided as "oneway" paths which, when provided with plural transfer elements with respect to the path of the conveyor elements, can enable the circulation of a work-piece or a carrier of work-pieces from a storage matrix to a transfer path and back to the storage matrix. This avoids a problem with a needed work-piece being located in the middle of other not-needed work-pieces in the storage matrix.

In an alternative embodiment, plural storage conveyor elements may be provided parallel to one another. Adjacent storage conveyor elements may be used to realize storage loops, thus obviating the need for moving stored work-pieces onto the conveyor process path when accessing a subsequent work-piece. Further embodiments include the use of a single storage conveyor element within multiple loops of storage conveyor elements, where work-pieces of different types proceed in opposite directions when leaving the storage conveyor element. The modularity of the present system further enables the realization of plural, nested loops of storage conveyor elements in which work-pieces may be rapidly exchanged between loops of storage conveyor elements, rotated within a single loop of storage conveyor elements, or retrieved to a transfer path of the conveyor network or to a machine tool. Massively parallel storage solutions can be readily designed and implemented without the need for dedicated floor space.

Such varying embodiments may be provided as pre-configured systems, or with the provision of appropriate sensing mechanisms and control logic may be auto-configuring according to a variety of parameters including competing storage needs for various types of work-pieces, time of day, etc. With either centralized or distributed control circuits, either or both of which may be employed in the presently disclosed storage system, simultaneous relocation of multiple work-pieces provides a far more efficient storage solution as compared to that afforded by the robotic stockers of the prior art. The control logic may provide buffering of each machine tool in the system and/or storing work-in-process (WIP) at the machine tool that is ready to be received and processed as soon as the machine tool becomes available.

The modular storage system as now disclosed may also be configured for use as an input or output buffer for use in conjunction with a machine tool or other processing station associated with a conveyor system.

In each factory using the present transport and storage system, an operating characteristic curve (OC) is associated therewith which relates the cycle time of the production (the elapsed time of the total manufacturing process) to the average utilization of the process machine tools (equipment). If the cycle time is fixed by customer demand, then the machine tool utilization is automatically defined by the OC. To eliminate this limitation, control logic for material handling is defined by the present invention. The control logic requires independent and high density movement of WIP directly between machine tools. Conveyor system accomplish this movement where other conventional vehicle fail. Local buffering and storing systems are the enabling technology for the conveyor system. The buffering and storing system must seamlessly interconnect to the conveyor network and is provided by the present invention.

In the above mentioned industries, the manufacturing process is highly recursive, i.e. the WIP re-enters a machine tool many times after it has been processed elsewhere. Typically, there may be hundreds of process machine tools to go through and re-enter several times in a different sequential fashion for each work-piece. Additionally, several work-pieces may be concurrently handled. Process machine tools are often placed in a spatial array according to function rather than operating sequence. There may be several machine tools, in different parts of a factory, capable of performing the next sequential operation on the WIP lot. From the start of the manufacturing process to the finish, the WIP lot may spend one to two months in the factory while moving between machine tools. These factories are frequently called chaotic as a mathematical system. Applicants have discovered that such factories achieve significant throughput gains if the work-piece handling design is based on a conveyor network where each process machine tool is connected to or is on the conveyor network. Then, in this non-linear manufacturing environment, the control logic according to the present invention sends and pulls each WIP lot to the next process machine tool as soon as the WIP lot is finished at the previous manufacturing step. The control logic is based on asynchronous and independent movement of each WIP lot, which is only possible with a conveyor network capable of moving each WIP independently of the other now matter how close they are to each other. The control logic according to the present invention is particularly applicable to the concept of conveyor networks and Applicants specifically utilize conveyor networks for these clean manufacturing industries and take advantage of the productivity gain therethrough.

In contrast, presently known logistics are based on discrete transport of the WIP using vehicle cars. This implies the need of assigning specific vehicle cars to transport specific WIP, thus making the work process wait for vehicle cars and vice versa. This process imposes a degree of synchronization of the otherwise independent WIP similar to in-line manufacturing. These known systems are forced to use push-pull logic which in turn requires the use of large floor stockers. When the WIP is finished at one machine tool, a carrier is inserted into a vehicle (when available) and sent (pushed) to a large floor stocker because the next process machine tool to be used is typically not available for immediate use. When the next machine tool becomes available, the WIP lot is requested to be transported thereto, which again requires the process of scheduling a vehicle car.

The inefficiencies of the presently known systems arise from the fact that there are not buffers/stockers immediately provided at the next machine tool. Because the vehicle cars are highly utilized for transport only, costly pile ups and bottle-necks often occur at the machine tool. Well known analytical solution of this problem and computer simulations show the serious drawbacks of this technique (see queuing theory, for example). Accordingly, the present invention is directed to solving these deficiencies in the known techniques by applying conveyor transport networks in conjunction with a native stocker and buffer at the machine tool for improving the machine tool utilization while maintaining the product cycle time as well as improving the financial costs in comparison to the known techniques.

Other aspects, features and advantages of the present invention are disclosed in the detailed description that follows.

DETAILED DESCRIPTION OF THE INVENTION

The conveyorized storage and transport system according to the embodiments of the present invention may be used in any type of processing industry requiring storage for maintaining inventories at multiple processing stations. The manufacture of semiconductor devices is one example of an industry that is particularly suited for the features provided by the storage and transport system according to the embodiments of the present invention. In the illustrations, various embodiments of the presently disclosed storage and transport system are referred to as a "field stocker."

Carriers conveyed by a clean-environment conveyor system may be pallets carrying one or more individual work-pieces. Alternatively, the conveyor elements may transport the work-pieces themselves without the need for carriers. In a semiconductor manufacturing process, substrates are usually carried in a transport carrier, while in flat panel manufacturing, the work-pieces may ride in carriers or directly on the conveyor elements. Carriers will be used as a general term for the items to be transported. Carriers are also referred to as the items which are stored in the presently disclosed storage system.

The presently disclosed storage system is intended for use with a conveyor system comprised of modular track elements or segments. These track elements include both straight elements, rotating elements, and elevator elements. Other specialized elements may be provided. The carrier width determines the conveyor element width, while the carrier length determines the minimum common denominator for the conveyor element length. In one embodiment of the present invention, conveyor elements are constructed of a predetermined and standard length and width, dependent on the carriers conveyed thereon. It is in general advantageous to construct conveyors with lengths that are integers of the carrier length or are related thereto. Combined with corner or junction elements, that are preferably of a square footprint, based on the length of the carrier, a rectilinear matrix of conveyor elements can be constructed easily and individualized according to the needs of the particular installation. These junction elements generally turn the carriers in transit of a corner, so as to maintain carrier orientation. With these basic elements, a matrix of conveyor element paths can be constructed in such a way that the matrix has the highest density while occupying a minimum area. The modularity of the foregoing conveyor system is also preferably employed in realizing the storage system of the present disclosure.

Figure 1:
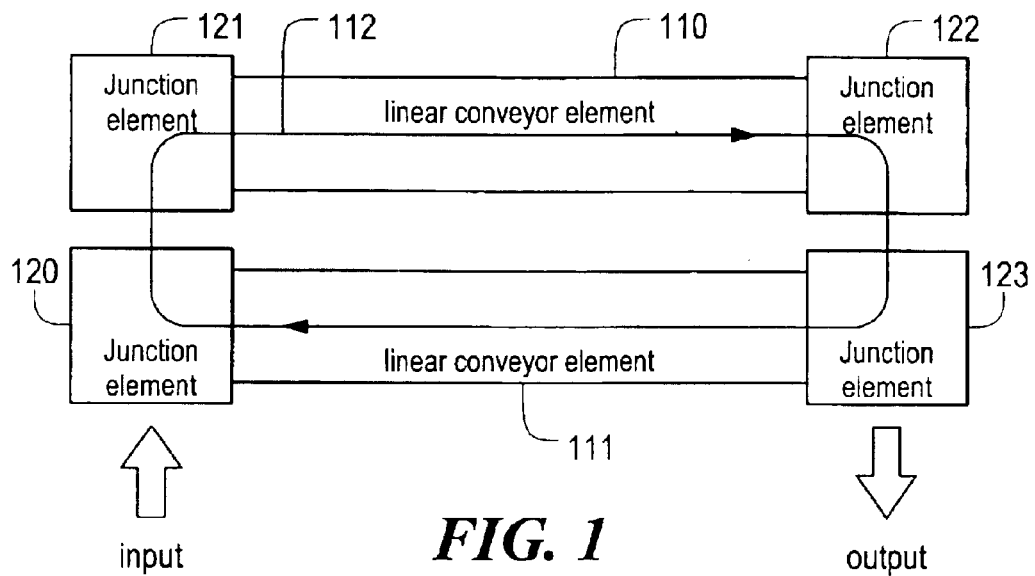
FIG. 1 illustrates a closed loop of storage conveyor elements.
Figure 2:
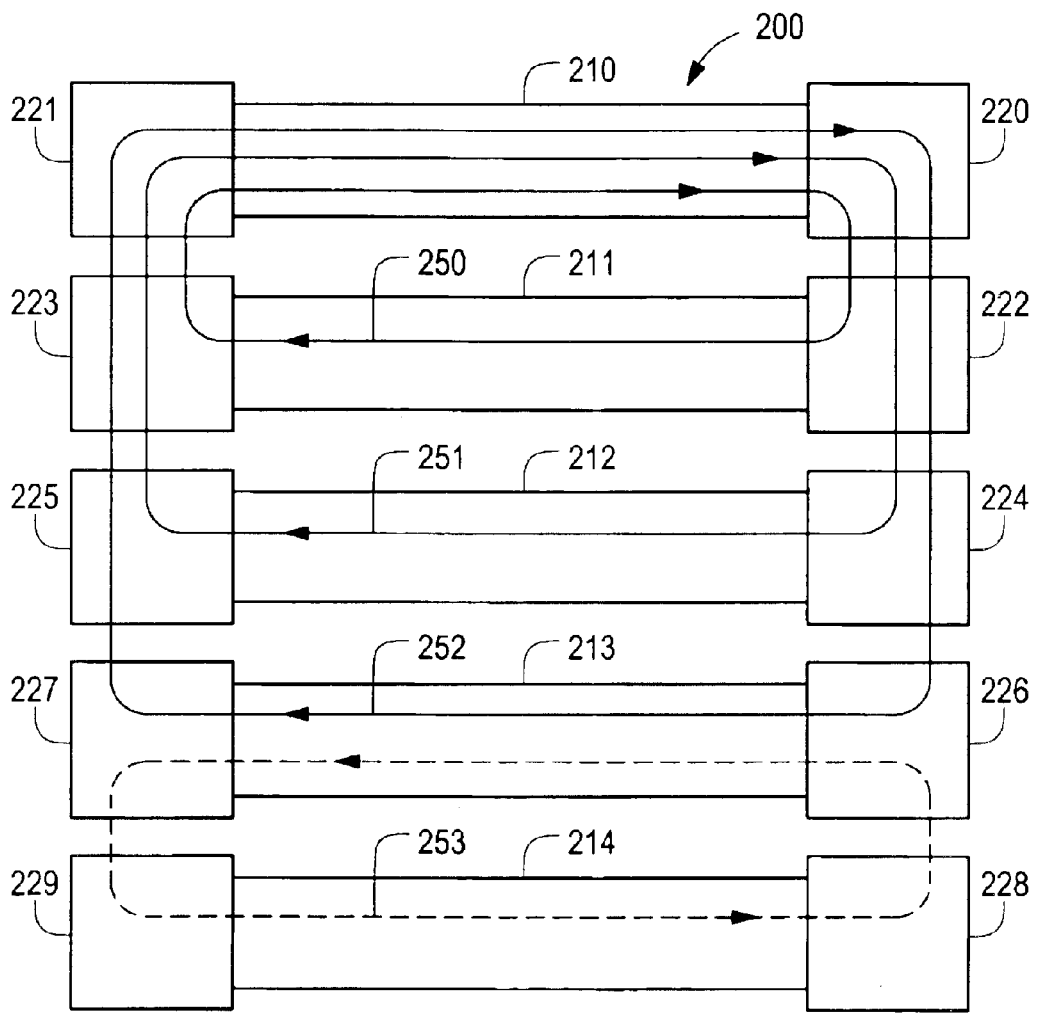
FIG. 2 illustrates a nested loop of storage conveyor elements.

In constructing one embodiment of such a storage system, linear conveyor elements 110 and 111 of equal lengths are assembled side by side and then connected to each other with junction elements 120–123 as illustrated in FIG. 1. In this manner, one or more closed loops 112 are formed within which carriers are circulated. Each of the linear conveyor elements 110 and 111 may be comprised of one or more discrete conveyor su-elements. Entry and exit of carriers into such a loop takes place at junction elements 120 and 123 respectively as shown by the arrows in FIG. 1. When linear conveyor elements 210–214 with respective pairs of junction elements 220 and 221, 222 and 223, 224 and 225, 226 and 227, and 228 and 229 on each end are arranged side by side into a matrix 200, the pairs of junction elements 220–229 become the connecting paths between the linear conveyor elements 210–214 as illustrated in FIG. 2. Such an arrangement of elements allows several closed loop circulatory paths 250–253, nested or otherwise, for the carriers, as illustrated for example in FIG. 2. The direction of circulation of the various paths need not be identical.

Figure 3:
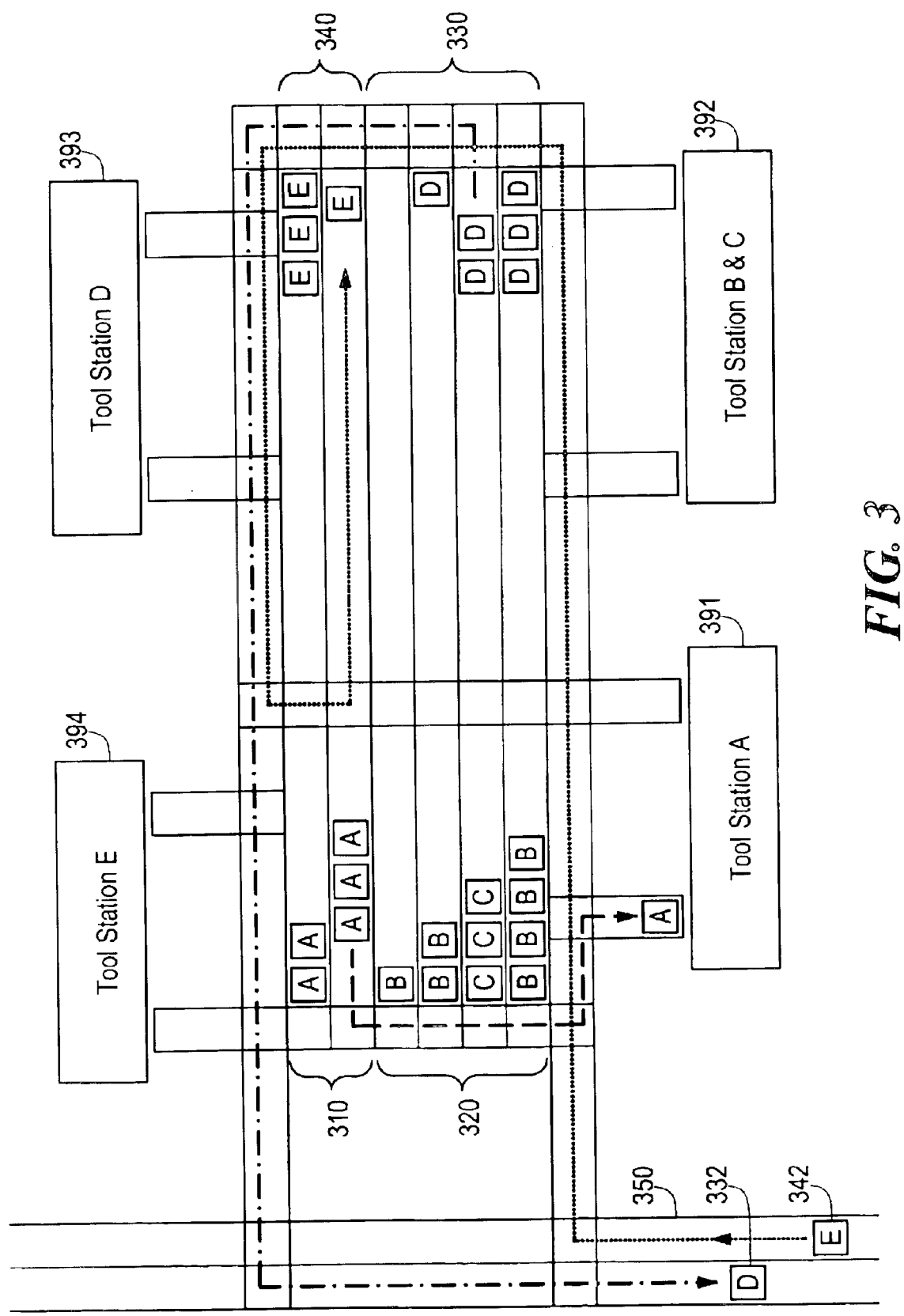
FIG. 3 illustrates a field stocker of storage conveyor elements having aggregated arrays of nested loops of storage conveyor elements.

A storage system having an aggregate storage matrix of four buffer sections or storage cells 310, 320, 330 and 340 as illustrated in FIG. 3 may be hung or incorporated at or near the ceiling in a manufacturing facility substantially proximate a similarly suspended conveyor system. One E type carrier 342 may be received from a conveyor "highway" 350 and stored in the buffer section 340, while one A carrier may be output from the buffer section 310 of the nested loop and delivered to a process station 391. A D carrier 332 in the buffer section 330 of the nested loop array may be returned to the conveyor highway 350. The fourth buffer section 320 is employed for storing more than one type of carrier, B and C carriers in this example.

Figure 4:
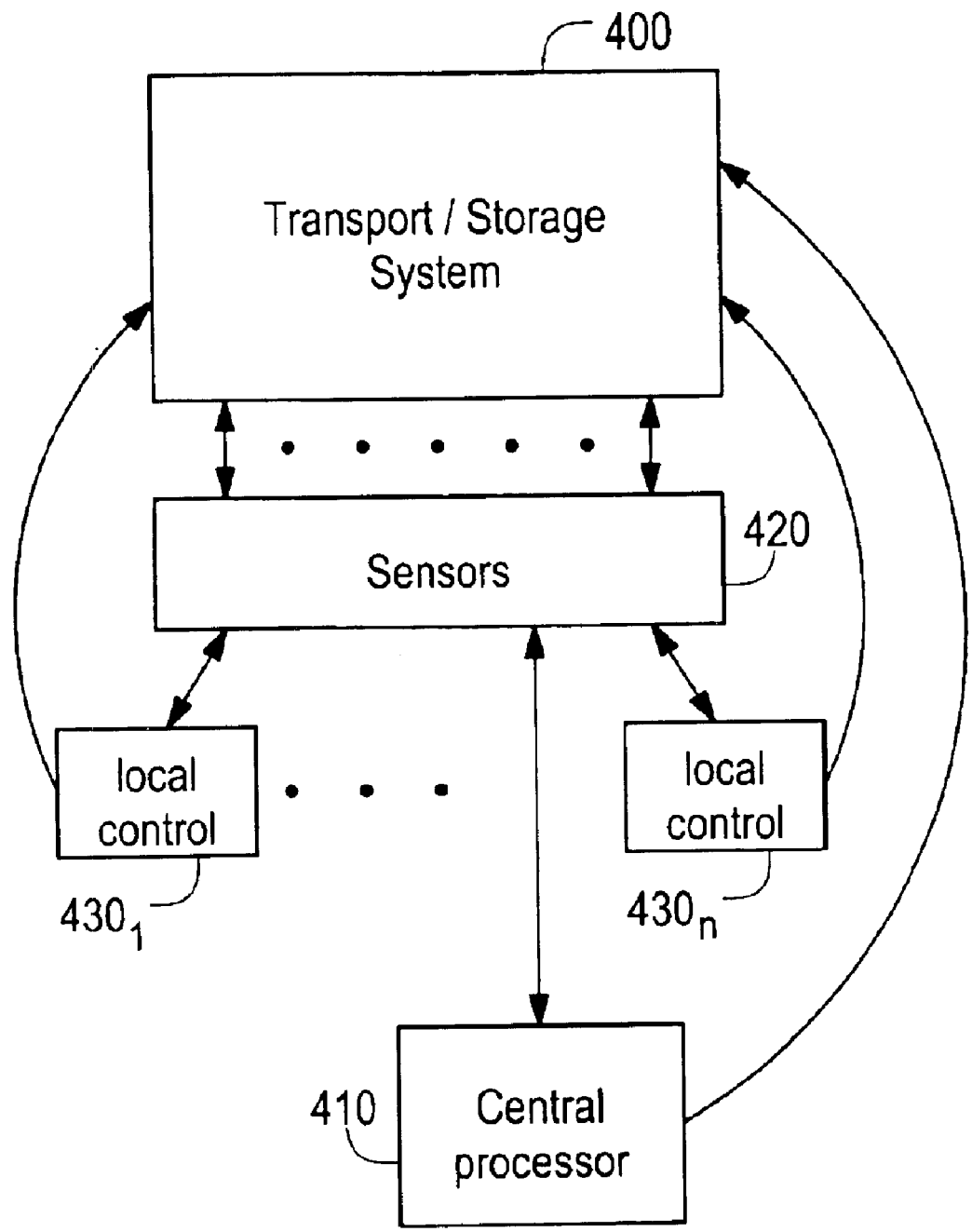
FIG. 4 is a block diagram of a field stocker system according to an embodiment of the present invention.

The control over transporting and storing the carriers may be realized by sensors located near nodal junction elements that detect identification codes, such as bar codes or other identifying indicia, included on an accessible portion of the carriers. As illustrated in FIG. 4, signals corresponding to detected codes from sensors 420 may be communicated to a centralized processing unit 410, such as by an RF transponder, bus interface, or other known transmitting device, so that the centralized processing unit 410 may determine the direction that the carrier is to be sent in the transport system 400. Alternatively, the detected identifying information may be provided to local controllers 4301–430, associated with the respective portion of the transport system 400. Control signals may then be sent to motive elements associated with the respective conveyor element for controlling the nodal junction in the desired direction, or for moving one or more carriers along a particular conveyor element. This applies whether the nodal junction element or conveyor element is part of a storage matrix or part of the conveyor highway, or both.

Circulation in a matrix can be asynchronously controlled with several movements of carriers occurring simultaneously. Such circulation allows the placement of any carrier at any location in the matrix, thus enabling the realization of a random access storage device. Maximum flexibility in terms of configurability and reconfigurability is thus provided.

Multiple parallel conveyor elements may be regarded as forming one or more buffer sections. The separation of one buffer matrix from another depends upon the rules associated with the constituent conveyor elements. For instance, two parallel conveyor elements, with associated nodal junction elements, may be used for conveying only carriers of one type, for example carriers of type A. They thus form a buffer section unto themselves. However, one or both of these conveyor elements may transport carriers of type A to and from another set of conveyor elements which themselves convey carriers of types A and B. The original two conveyor elements are thus part of two buffer sections.

When similar buffer sections are aggregated into a larger system, the outer peripheral nodal junction elements may be shared, thus creating an even larger matrix of nested loops of storage conveyor elements. Carriers entered into such a system may be transported to and stored in any specific location of the aggregate storage matrix. In general, a storage system for carriers in the manufacturing process includes an aggregate storage matrix of buffer sections where the carriers are stored serially within each buffer section. Each buffer section is made of multiple conveyor elements, with the buffer sections aggregated to share common input and output nodal junction elements.

In the simplest form of the present invention, carrier flow is locally controlled in an asynchronous manner so that carrier collisions are automatically and inherently avoided. The conveyor elements which comprise a buffer section may also communicate with each other for efficient exchange of carriers according to predetermined control logic. Furthermore, the buffer conveyor elements may serially rotate the respective carriers between each other so that any of the serially stored carriers may be accessed and discharged. The serially stored carriers may also be collaboratively rotated between any two buffer sections independently and asynchronously from other similar and concurrent rotations of other buffer sections. As previously mentioned, control over carrier movement within a buffer section or between buffer sections may also be provided centrally.

Additionally, such larger systems, at remote physical locations in the system, may be network connected to each other, forming a unified system of material storage and delivery with utmost capacity and efficiency throughout an entire factory. A storage system as previously described, with direct input and output ports, may be located near plural process stations, so that storage may be provided where physically needed in each process. When so done, a storage system is easily constructed of the same modular conveyor elements. Integration of storage with conveyance is simplified with none of the transfer bottle-necks associated with carrier hand-over between a traditional robotic stocker and a conveyor.

The factory wide transport and storage system according to the embodiments of the present invention is advantageous in achieving the goal of low cycle time and high utilization of the tool stations. When a work-in-process (WIP) is discharged from a process onto the network of conveyor elements, the WIP is made available to demand pull by the buffer sections or the field stocker at the next tool station. This procedure allow storage for immediate access at the next tool station, and assures high utilization of the station. It is important that both the storage and transport of WIP within the system be of one unit to accomplish this natural flow of WIP without the interference of other move demands from outside the system, such as the tool stations themselves. Preferably, the buffer sections or the field stocker serve more than one tool station if there is more than one process tool dedicated to the same value add process. In this case it can be assured that the first WIP arriving into the buffer section will be served first. Without such an arrangement, first-in-first-out (FIFO) logic may not be implemented and factory efficiency will suffer.

Figure 5:
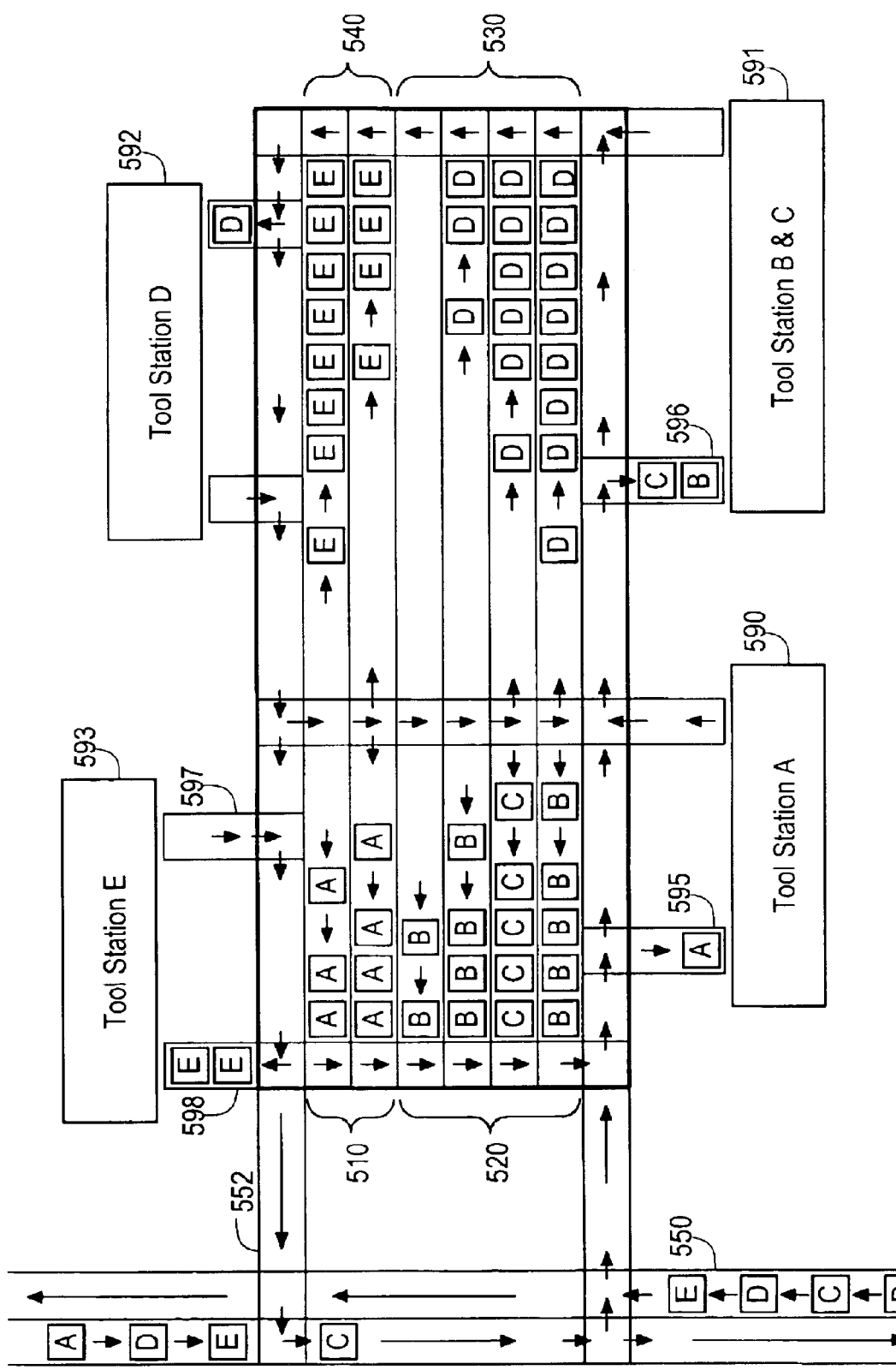
FIG. 5 illustrates a field stocker of storage conveyor elements having aggregated arrays of nested loops of storage conveyor elements that are networked into a unified system for material storage, wherein the adjoining machine process tools have direct I/O with an optional unit buffer.

As illustrated in FIG. 5, one embodiment of a storage system according to the present disclosure includes four buffer sections 510, 520, 530 and 540 corresponding to each of four process tool stations: Tool Station A 590, Tool Station B&C 591, Tool Station D 592 and Tool Station E 593. In this example, Tool Station A 590 and Tool Station B&C 591 each include their respective buffer section 595 or 596 for storing carriers until input into the respective process tool station. Tool Station D 592 retrieves carriers for immediate processing, i.e., without any buffering on input or output. Tool Station A 590, Tool Station B&C 591, Tool Station D 592 are configured for "straight I/O," or input to the respective tool upstream from the output from the respective tool. In contrast, Tool Station E 593, which also has buffering at its input 598 and output 597, is a "reverse I/O" tool, meaning that its input is downstream of its output with respect to the flow of carriers along the conveyor peripheral path 552.

In one method of controlling the movement of a storage array, the circulating direction in each buffer section is identical. In this way, control logistics are simplified because only conflicts between carriers in motion at junctions may occur. These conflicts can then be automatically resolved according to, for instance, the order of first arrival for transporting through the junction. When a large number of conveyor elements are aggregated into a single storage system, and when several of these systems are joined into a larger one, such a flow method results in carrier flow loops within larger flow loops. For instance, a peripheral pair of common input and output conveyor elements may be joined so that carriers may circulate circumferentially around a grouping of other buffer sections. The boundary of each buffer section may be shared at the adjoining side so that the flow direction on the shared side is identical. Multiple buffer sections may be joined to form transport and storage paths having loops within loops.

A control methodology where the direction of the flow is alternated by demand and may occur in either of two possible directions is also possible. This type of control requires more complex software and may be more efficient in some circumstances. The flow direction being alternated on demand means that carrier flow conflict can occur on linear conveyor elements as well as at nodal junction elements. The direction of circulation of each buffer section may be determined on demand and may be contradictory with concurrent circulation in other buffer sections such that the shared circumferential conveyor elements have an arbitrary direction of flow.

A unifying conveyor network may connect multiple storage systems. Thereby, any carrier contained in any storage system can be retrieved by a controller capable of accessing each individual buffer section in any storage system. The selected carrier is then transported and stored in any of the other interconnected systems. Conflicts are resolved with a highly sophisticated and more substantial control logic.

Aggregates of these storage systems may be inserted into a generalized conveyor highway, serving as the point of material distribution in a bay of process tools. When so done, the outer periphery of the aggregate system becomes the generalized conveyor highway. Each such bay system may be connected to a series of neighboring bays, similarly equipped with respective transport and storage systems. In each such bay, the peripheral transport highway may best be connected to a series of outer loops, where the flow of material is counter to the flow in the storage and highway system. Such counter flow loops are used for buffering carriers waiting for process tools in the bay. Such buffering may also be used as random storage and retrieval systems because they can be configured to rotate the buffered carriers through the storage and transport system conveyor elements for random access selection of any particular carrier.

Figure 6:
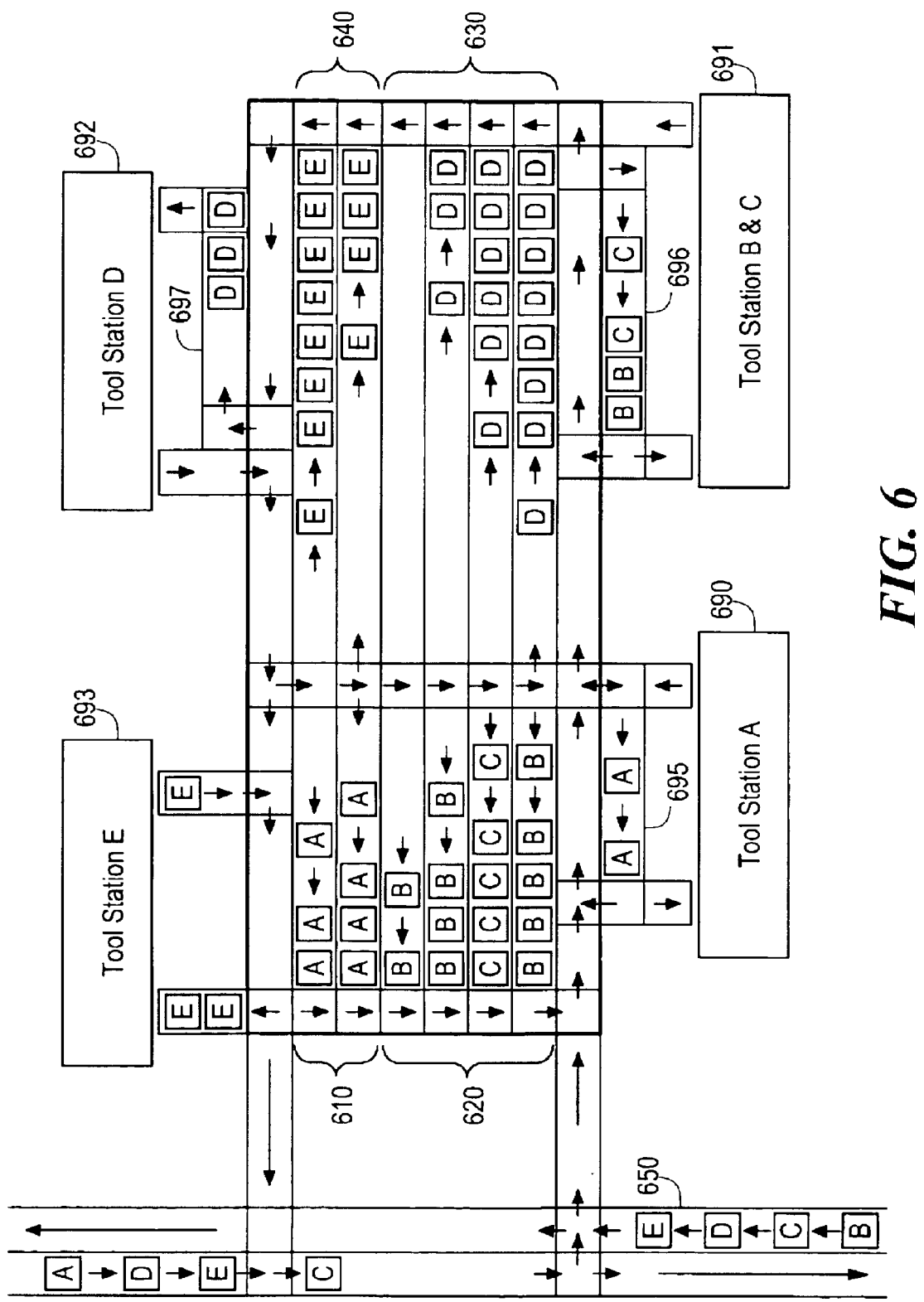
FIG. 6 illustrates a field stocker of storage conveyor elements having aggregated arrays of nested loops of storage conveyor elements that are networked into a unified system for material storage, wherein various tool storage buffers are illustrated.

A storage system having four buffer sections 610, 620, 630 and 640 corresponding to four process stations 690, 691, 692 and 693 is illustrated in FIG. 6. Again, this storage system may be suspended or incorporated at or near the ceiling. Each of the buffer sections 610, 620, 630 and 640 is associated with one of four process stations 690–693, similar to the system illustrated in the embodiment associated with FIG. 5. However, in the present embodiment, various types of storage conveyor elements are provided at the tool stations. At Tool Station A 690 and Tool Station B&C 691, random access storage buffers 695 and 696 are utilized; the random access storage buffers 695 and 696 circulate the carriers in a closed loop between the respective buffer section(s) and the conveyor peripheral path until a carrier that is desired for processing at the respective tool reaches the input nodal junction element for that tool.

Tool Station A 690 includes random retrieval and storage for the carriers achieved by bi-directionally operating the movement of the carriers inside of the buffer sections so that the serial order of the carriers may be rearranged for discharge or storage. Tool Station B&C 691 is similar to Tool Station A 690, though without bi-directional nodal junction elements; instead, discrete input and output nodal junction elements are provided. At Tool Station D 692, FIFO buffer storage is provided having a limited, predetermined amount of carrier storage 697 available adjacent Tool D 692. At Tool Station E 693, single buffer storage is provided near Tool E. Again, sensors and RF transponders may be associated with the nodal junction elements for sensing and controlling the direction in which carriers are to be sent.

It should be realized that the present invention is not limited to the storage configurations illustrated in and described in conjunction with the figures and that different storage configurations may be incorporated into a system using some or all of the various storage combinations as determined by the needs of the processing application.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A system for storing and transporting work-pieces in a clean manufacturing environment, comprising:
    at least one storage matrix comprised of a plurality of buffer sections for storing and circulating said work-pieces;
    a transport path for transporting said work-pieces to and from said storage matrix;
    a plurality of sensors for sensing positional and identification information relating to said work-pieces within said system;
    a control processor operatively communicative with said sensors, said storage matrix and said transport path for configuring said storage matrix and for controlling storage, circulation and transport of the work-pieces in response to the positional and identification information received from said sensors; and
    a plurality of tool stations associated with said buffer sections for receiving said work-pieces therefrom, processing said work-pieces, and returning said work-pieces to said storage matrix or to said transport path in response to communication from said control processor,
    wherein said storage matrix and said transport path are comprised of modular conveyor elements.

2. The system according to claim 1, wherein said modular conveyor elements are comprised of linear conveyor elements for moving said work-pieces in a straight path, rotating conveyor elements for rotating the direction of said work-pieces, elevating conveyor elements for transporting said work-pieces in a vertical path, and junction elements for allowing entry and exit of said work-pieces to said storage matrix.

3. The system according to claim 2, wherein said junction elements are bi-directional elements.

4. The system according to claim 2, wherein said sensors are positioned adjacent to said junction elements.

5. The system according to claim 1, wherein said storage matrix is mounted adjacent to a ceiling mounted conveyor.

6. The system according to claim 1, wherein said control processor is a centralized processing unit.

7. The system according to claim 1, wherein said control processor is a plurality of distributed local control units.

8. The system according to claim 1, further comprising carriers for transporting one or more of said work-pieces.

9. The system according to claim 8, wherein said carriers comprise identifying indicia for said work-pieces associated therewith.

10. The system according to claim 9, wherein said identifying indicia are communicated form said sensors to said control processor by an RF transponder or a bus interface.

11. The system according to claim 1, wherein said modular conveyor elements have a length defined by an integer value of said work-piece length.

12. A storage system for work-in-process material or carriers transporting said material comprising:
a two-dimensional, aggregate storage matrix comprising plural, mutually-parallel linear conveyor elements for selectively, serially transporting said material or carriers, and
plural pairs of junction elements, each pair of junction elements associated with a respective one of said linear conveyor elements for selectively transporting said material or carriers to an adjacent linear conveyor element or other junction element;
a transport path in communication with said aggregate storage matrix for transporting said material or carriers to and from said aggregate storage matrix; and
a tool buffer comprised of a linear conveyor element and a respective pair of junction elements, said tool buffer disposed proximate said transport path for selectively receiving said material or carriers therefrom and for selectively sending said material or carriers thereto.

13. The storage system of claim 12, further comprising a controller for selectively controlling the operation of each of said junction elements.

14. The storage system of claim 12, wherein said aggregate storage matrix and said transport path are configured to transport said material or carriers.

15. The storage system of claim 12, wherein each of said linear conveyor elements is comprised of an integer number of linear conveyor segments, each segment having a length defined as an integer multiple of the length of each unit of said material or carriers.

16. The storage system of claim 12, further comprising at least one sensor and independently controllable motive units disposed in conjunction with each of said plural linear conveyor elements and said junction elements for enabling asynchronous movement of said material or carriers therebetween.

17. The storage system of claim 16, wherein at least two of said linear conveyor elements and respective pairs of junction elements define a buffer section of said aggregate storage matrix, and wherein said aggregate storage matrix is comprised of one or more of said buffer sections.

18. The storage system of claim 17, wherein said motive units are operable to serially transport said material or carriers within said buffer sections in a unidirectional rotation.

19. The storage system of claim 17, wherein said aggregate storage matrix is comprised of a plurality of said buffer sections, each operable to independently and serially transport said material or carriers between said ones of said respective plural linear conveyor elements and said respective junction elements.

20. The storage system of claim 17, wherein said motive units are operable to serially transport said material or carriers within said buffer sections in a bi-directional rotation.

21. The storage system of claim 17, wherein one of said plural linear conveyor elements comprises part of plural ones of said buffer sections.

22. The storage system of claim 17, wherein said transport path is comprised of at least one transfer element disposed in communication with at least one of said buffer sections and operable to transfer said material or carriers between said transport path and said aggregate storage matrix.

23. The storage system of claim 17, wherein said aggregate storage matrix is configured as a one- or two-dimensional array of said buffer sections.

24. The storage system of claim 23, wherein said transport path is operable to provide a unidirectional transport path for said material or carriers and wherein said buffer sections comprising said aggregate matrix are operable to provide a unidirectional transport path for said material or carriers conveyed therein.

25. The storage system of claim 23, wherein said transport path is operable to provide a unidirectional transport path for said material or carriers and wherein said buffer sections comprising said aggregate storage matrix are operable to provide a bi-directional transport path for said material or carriers conveyed therein.

26. The storage system of claim 17, wherein a first of said buffer sections is comprised of a pair of junction elements associated with a linear conveyor element which is not part of said first buffer section.

27. The storage system of claim 12, further comprising mounting fixtures for disposing said aggregate storage matrix proximate the ceiling of a building.

28. The storage system of claim 12, further comprising a conveyor network in communication with said transport path and a control system in communication with said aggregate storage matrix, said transport path and said conveyor network for selectively transporting said material or carriers therebetween.

29. The storage system of claim 28, wherein said aggregate storage matrix is a first storage matrix and said transport path is a first transport path, said storage system further comprising a second storage matrix and a second transport path in communication with said control system, whereby said control system is operable to selectively transport said material or carriers between said first and second storage matrices via said first and second transport paths and said conveyor network.

30. The storage system of claim 12, further comprising a tool port segment disposed adjacent a junction element of said tool buffer for enabling access by a co-located tool or tools to said material or carriers from said tool buffer.

31. The storage system of claim 30, further comprising plural tool buffers, each of said tool buffers providing unidirectional transport to said material or carriers disposed thereon.

32. The storage system of claim 31, wherein said transport path is operable to provide unidirectional transport to said material or carriers disposed thereon, wherein the direction of said unidirectional transport provided by said plural tool buffers is opposite the direction of said unidirectional transport provided by said transport path.

* * * * *